US011195793B2

(12) United States Patent
Chava et al.

(10) Patent No.: US 11,195,793 B2
(45) Date of Patent: Dec. 7, 2021

(54) METAL FILLING IN A DIELECTRIC LAYER UNDER METAL LAYER ONE (M1) AND ABOVE AN ACTIVE DEVICE LAYER IN SEMICONDUCTOR DEVICES

(71) Applicant: QUALCOMM Incorporated, San Diego, CA (US)

(72) Inventors: Bharani Chava, Cork City (IE); Stanley Seungchul Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 35 days.

(21) Appl. No.: 16/743,350

(22) Filed: Jan. 15, 2020

(65) Prior Publication Data

US 2021/0217697 A1    Jul. 15, 2021

(51) Int. Cl.
*H01L 23/522*  (2006.01)
*H01L 21/768*  (2006.01)
*H01L 23/535*  (2006.01)
*H01L 23/528*  (2006.01)

(52) U.S. Cl.
CPC .... *H01L 23/5228* (2013.01); *H01L 21/76805* (2013.01); *H01L 21/76895* (2013.01); *H01L 23/5286* (2013.01); *H01L 23/535* (2013.01)

(58) Field of Classification Search
CPC ............. H01L 23/5228; H01L 23/5286; H01L 21/76895; H01L 21/76805; H01L 23/535
See application file for complete search history.

(56) References Cited

U.S. PATENT DOCUMENTS

2019/0295892 A1*    9/2019  Samra ................... H01L 23/528

\* cited by examiner

*Primary Examiner* — Quoc D Hoang
(74) *Attorney, Agent, or Firm* — Patterson & Sheridan, L.L.P.

(57) ABSTRACT

Certain aspects of the present disclosure provide apparatus and techniques for fabricating a semiconductor device. A semiconductor device includes: an active device layer a local interconnect layer disposed above the active device layer; a dielectric layer disposed above the local interconnect layer; a metal layer disposed above the dielectric layer; and one or more metal sections disposed in the dielectric layer underneath one or more metal regions of the metal layer, wherein none of the one or more metal sections is electrically connected to a trace in the local interconnect layer.

20 Claims, 5 Drawing Sheets

METAL FILLING IN A DIELECTRIC LAYER UNDER METAL LAYER ONE (M1) AND ABOVE AN ACTIVE DEVICE LAYER IN SEMICONDUCTOR DEVICES

BACKGROUND

Field of the Disclosure

Aspects of the present disclosure relate to integrated circuits, and more particularly, to apparatus and techniques for adding metal sections in a dielectric layer under a routed metal layer and above an active device layer in semiconductor devices (e.g., integrated circuits (ICs)).

Description of Related Art

Electronic devices, such as computers, wireless communications devices (e.g., cellular phones and Wi-Fi access points), and calculators, have come into widespread use in recent years. Such electronic devices typically include one or more semiconductor devices (e.g., integrated circuits (ICs)). These semiconductor devices typically include a power distribution network (PDN) of conductors in a first metal layer (i.e., metal layer one (M1)), which supplies electric power and ground connections to active devices (e.g., transistors) of the semiconductor devices.

Shrinking device sizes and conductor sizes may enable electronic devices to have a greater density of components, as compared to previously known electronic devices. For example, a cellular phone may be smaller than previously known models, due to smaller ICs in the phone. However, the smaller conductors may cause decreased electrical performance (e.g., increased power consumption) and thermal performance (e.g., increased heat generation), due to the smaller conductors having increased resistance.

Shrinking device sizes, faster switching frequencies, and increasing power consumption in semiconductor devices may cause large switching currents to flow in the power distribution network, which may degrade performance and reliability. A robust power distribution network is essential to ensure reliable operation of circuits in a semiconductor device. Due to the resistance of interconnects constituting the network, there is a voltage drop across the network, commonly referred to as the IR (current*resistance) drop. The package of the IC may supply current to pads of the power grid by means of package leads. Although the resistance of the package leads may be low, the inductance of the package leads can be significant and may cause a voltage drop at the pad locations due to the time-varying current drawn by the active devices in the semiconductor device. This voltage drop may be referred to as the di/dt-drop. Therefore, the voltage seen at the devices may be calculated as the supply voltage minus the IR-drop and the di/dt-drop.

Excessive voltage drops in the power distribution network may reduce switching speeds and noise margins of circuits and may inject noise, which might lead to functional failures. High average current densities may also lead to undesirable wearing out of metal wires due to electromigration (EM). Thus, it is desirable for a PDN to achieve precise voltage regulation at the active devices notwithstanding the wide fluctuations in power demand across a semiconductor device while using a minimum area of the metal layers. A robust power distribution network is desirable for meeting performance specifications and ensuring reliable operation.

SUMMARY

The methods and assemblies of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include decreased resistance of PDNs in semiconductor devices, improved integrated circuit (IC) reliability, and simplified metal layer 3 (M3) patterning in IC fabrication processes.

Certain aspects of the present disclosure provide a method for fabricating a semiconductor device. The method generally includes routing a local interconnect layer above an active device layer; routing a metal layer above the active device layer, wherein the metal layer is separated from the active device layer by a dielectric layer; and adding one or more metal sections in the dielectric layer underneath one or more metal regions of the routed metal layer, wherein none of the one or more metal sections is electrically connected to a trace in the local interconnect layer.

Certain aspects of the present disclosure provide a semiconductor device. The semiconductor device generally includes an active device layer; a local interconnect layer disposed above the active device layer; a dielectric layer disposed above the local interconnect layer; a metal layer disposed above the dielectric layer; and one or more metal sections disposed in the dielectric layer underneath one or more metal regions of the metal layer, wherein none of the one or more metal sections is electrically connected to a trace in the local interconnect layer.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Aspects of the present disclosure provide apparatus and methods for adding metal sections in a dielectric layer under a routed metal layer and above an active device layer in semiconductor devices (e.g., integrated circuits (ICs)). The additional metal may be added at a post-route design stage to avoid interfering with signal connectivity in a local interconnect layer.

The previously known techniques for routing power distribution network (PDN) connections in semiconductor devices typically cause routing of the M3 layer (the third metal layer) to be costly and may cause the M3 layer to be highly resistive and inefficient from a track-usage perspective. In semiconductor devices intended for use in automobiles, there are stringent requirements for both resistivity of the PDN and current conducted without electromigration (EM) occurring. Adding metal sections in a dielectric layer under a routed metal layer and above an active device layer in a semiconductor device may most likely both decrease resistivity of the PDN and increase the current the PDN can carry without suffering from EM, as well as enabling more efficient track usage (e.g., in an interconnect layer).

Figure 1:
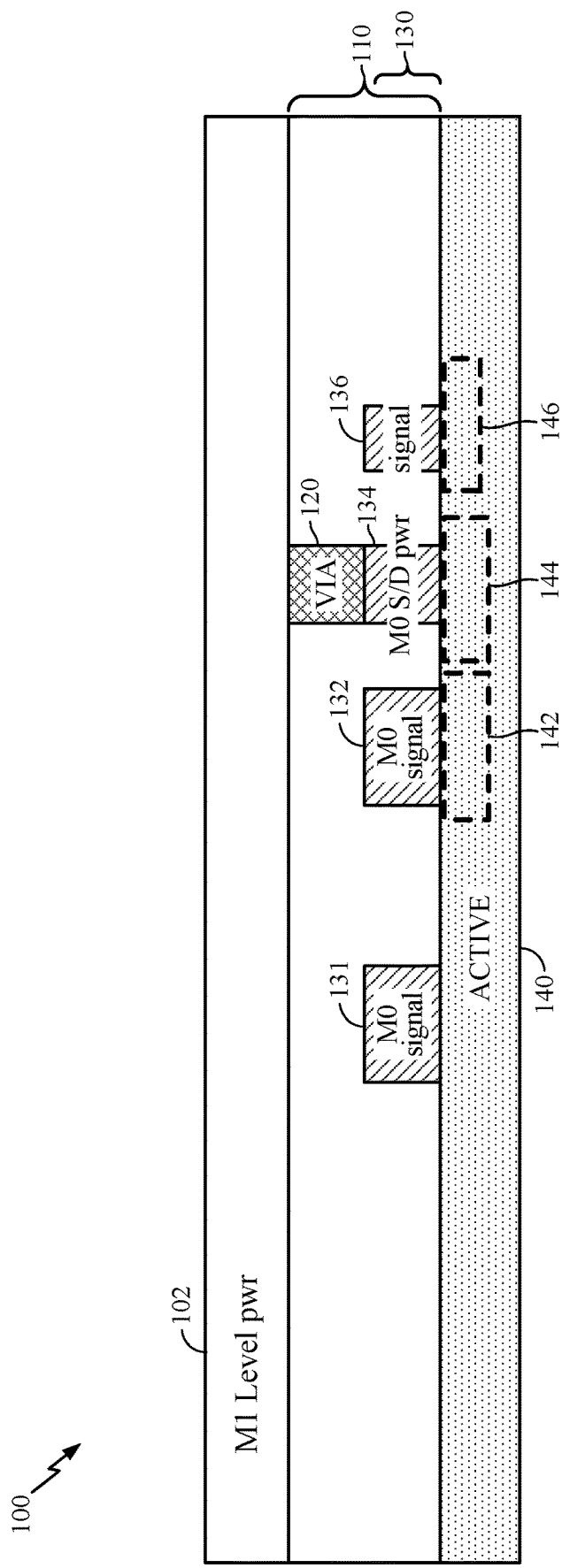
FIG. 1 is a cross-sectional schematic view of an exemplary semiconductor device, in accordance with previously known techniques.

FIG. 1 is a cross-sectional schematic view of an exemplary semiconductor device 100, in accordance with previously known techniques. The semiconductor device 100 includes a metal layer 102 (e.g., a first metal layer, referred to as "M1"), a dielectric layer 110, a local interconnect layer 130 (often referred to as a zero-metal layer or "M0"), and an active device layer 140. The active device layer 140 includes one or more active devices 142, 144, and 146 (e.g., transistors) that may send signals conducted to other active devices by one or more local interconnects 131, 132, and 136 (also referred to as traces) formed (e.g., by a routing process) in the local interconnect layer 130. At least one via 120 may be formed in the dielectric layer 110. A region (e.g., a power strip) of the metal layer 102 may be part of a power distribution network (PDN) of the semiconductor device and may supply electric power that is conducted by the via 120 (and the local interconnect 134) to a terminal (e.g., a source or a drain) of a transistor in the active device layer 140, as illustrated. Alternatively, the region of the metal layer 102 may be connected to electrical ground and may connect the ground to a terminal of a transistor in the active device layer 140 through the via 120. Due to the thinness of the metal layer 102, which may be designed for a low coupling capacitance, the metal layer 102 may have a relatively high resistivity and a relatively low electromigration current limit, which may cause the semiconductor device 100 to have relatively poor reliability characteristics. Examples of relatively high resistivity and relatively low electromigration current limit ($I_{DC}$ limit) of an example metal layer 102 are shown in the table below:

| | |
|---|---|
| M1 resistivity | 130 Ω/μm |
| Power rail electromigration limit | 80 μA |

Figure 2:
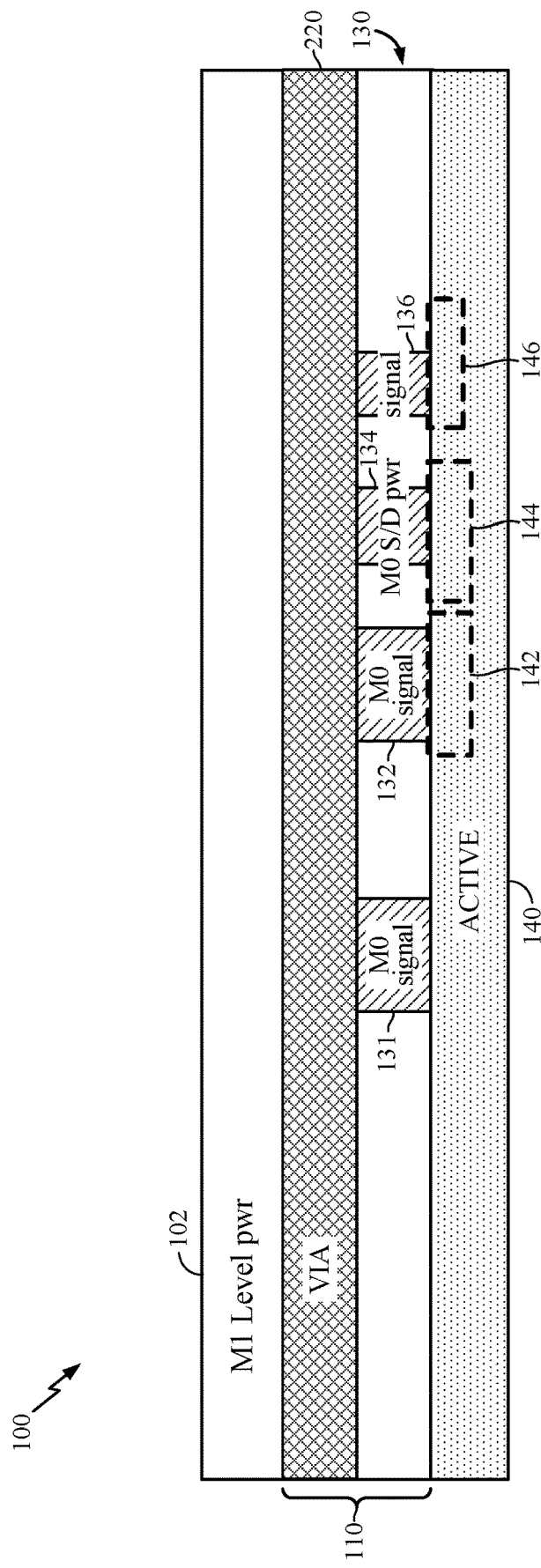
FIG. 2 a cross-sectional schematic view of an exemplary semiconductor device, in accordance with certain aspects of the present disclosure.

FIG. 2 is a cross-sectional schematic view of an exemplary semiconductor device 200, in accordance with certain aspects of the present disclosure. The semiconductor device 200 is similar to the semiconductor device 100 shown in FIG. 1, with features that are the same having the same labels as shown in FIG. 1. In the exemplary semiconductor device 200, a metal layer 220 under fills a region of the metal layer 102 before routing the local interconnects 131, 132, 134, and 136. The metal layer 220 is electrically coupled to the metal layer 102 in this region. Thus, the combination of the metal layer 220 and the metal layer 102 may have a lower resistivity in this region than the metal layer 102 alone. Similarly, the combination of the metal layer 220 and the metal layer 102 may have a higher electromigration current limit in this region than the metal layer 102 alone. However, the metal layer 220 may be expected to contact the local interconnects 131, 132, 134, and 136. The contact of the metal layer 220 with the interconnects 131, 132, and 136 shorts those interconnects to the power distribution network or alternatively to ground. Shorting the interconnects 131, 132, and 136 to the PDN or to ground prevents the interconnects from conveying signals between the active devices of the active device layer, thus preventing the semiconductor device 200 from operating correctly.

Example Metal Filling Under M1 Layer of Semiconductor Devices

Aspects of the present disclosure provide techniques for adding metal sections in a dielectric layer under a routed metal layer and above an active device layer in semiconductor devices (e.g., integrated circuits (ICs)).

In aspects of the present disclosure, metal sections in a dielectric layer underfill one or more regions of a routed metal layer and are above an active device layer in a semiconductor device (e.g., an integrated circuit (IC)). The one or more regions of the routed metal layer may act as part of a power distribution network (PDN) of the semiconductor device by being connected to either a power source or to ground.

According to aspects of the present disclosure, the above-described metal sections decrease resistivity of the regions of the routed metal layer while the dielectric layer insulates local interconnects in the semiconductor device from contact with the metal sections, thus preventing the local interconnects from being shorted to ground or to a power source.

Figure 3:
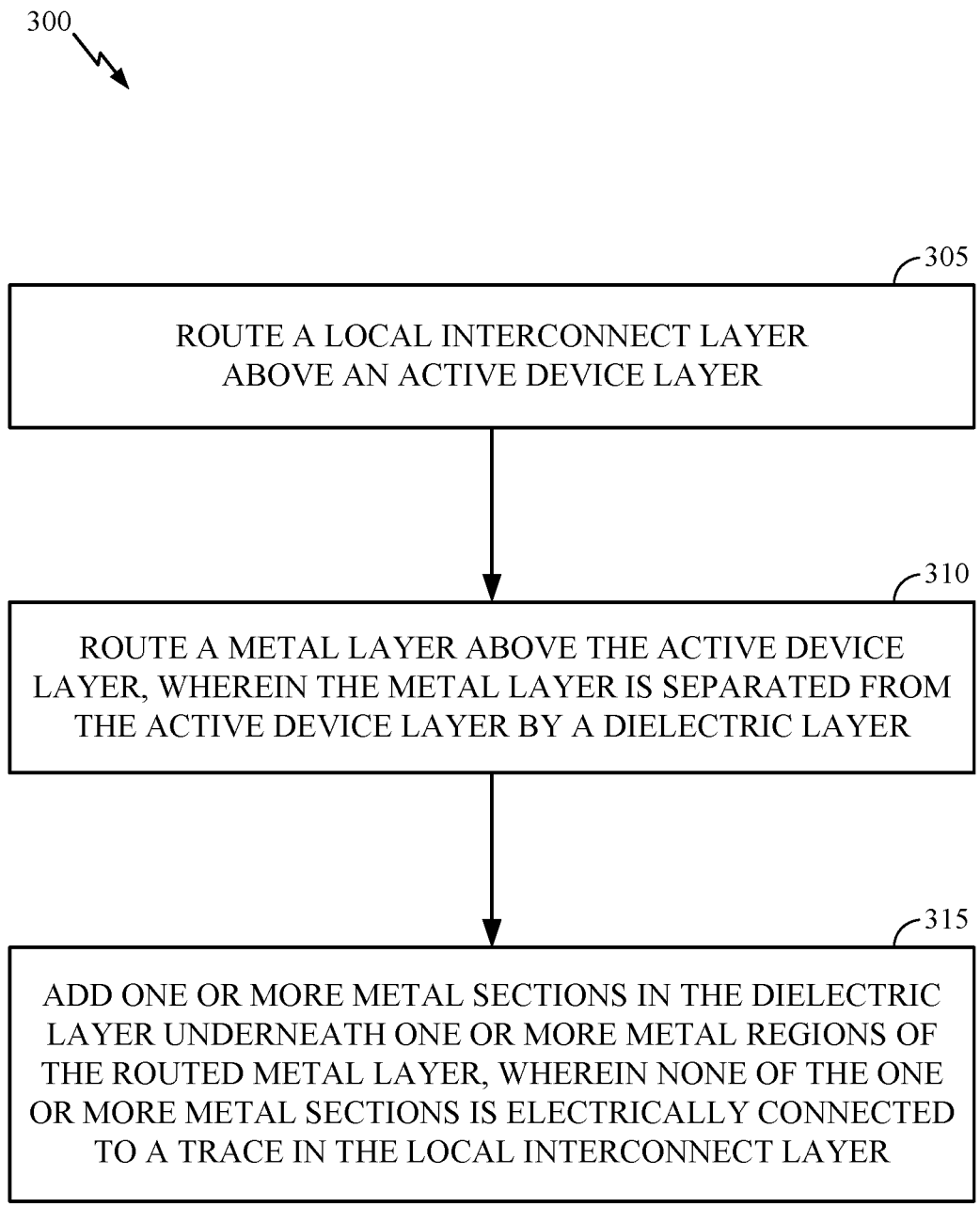
FIG. 3 is a flow diagram illustrating example operations for fabricating a semiconductor device, in accordance with certain aspects of the present disclosure.

FIG. 3 is a flow diagram illustrating example operations 300 for fabricating a semiconductor device, in accordance with certain aspects of the present disclosure. The operations 300 may be performed, for example, by a semiconductor device fabrication facility.

The operations 300 may begin, at block 305, by routing a local interconnect layer (e.g., local interconnects 131, 132, 134, and 136 described above with reference to FIG. 1) above an active device layer (e.g., active device layer 140 described above with reference to FIG. 1).

Operations 300 continue, at block 310, by routing a metal layer (e.g., metal layer 102 described above with reference to FIG. 1) above the active device layer. The metal layer is separated from the active device layer by a dielectric layer (e.g., dielectric layer 110 described above with reference to FIG. 1).

Operations 300 continue, at block 315, by adding one or more metal sections (e.g., metal sections 440, 442, and 444 described below with reference to FIG. 4) in the dielectric layer underneath one or more metal regions of the routed metal layer. In this case, none of the one or more metal sections is electrically connected to a trace (e.g., interconnects 131, 132, and 136 described above with reference to FIG. 1 and also shown in FIG. 4) in the local interconnect layer (e.g., local interconnect layer 130 described above with reference to FIG. 1 and also shown in FIG. 4). In other words, the one or more metal sections (added underneath the one or more metal regions) may be electrically disconnected from signal traces in the local interconnect layer.

According to aspects of the present disclosure, operations 300 may include fabricating the semiconductor device according to the routed local interconnect layer, the routed metal layer, and the one or more metal sections.

Figure 4:
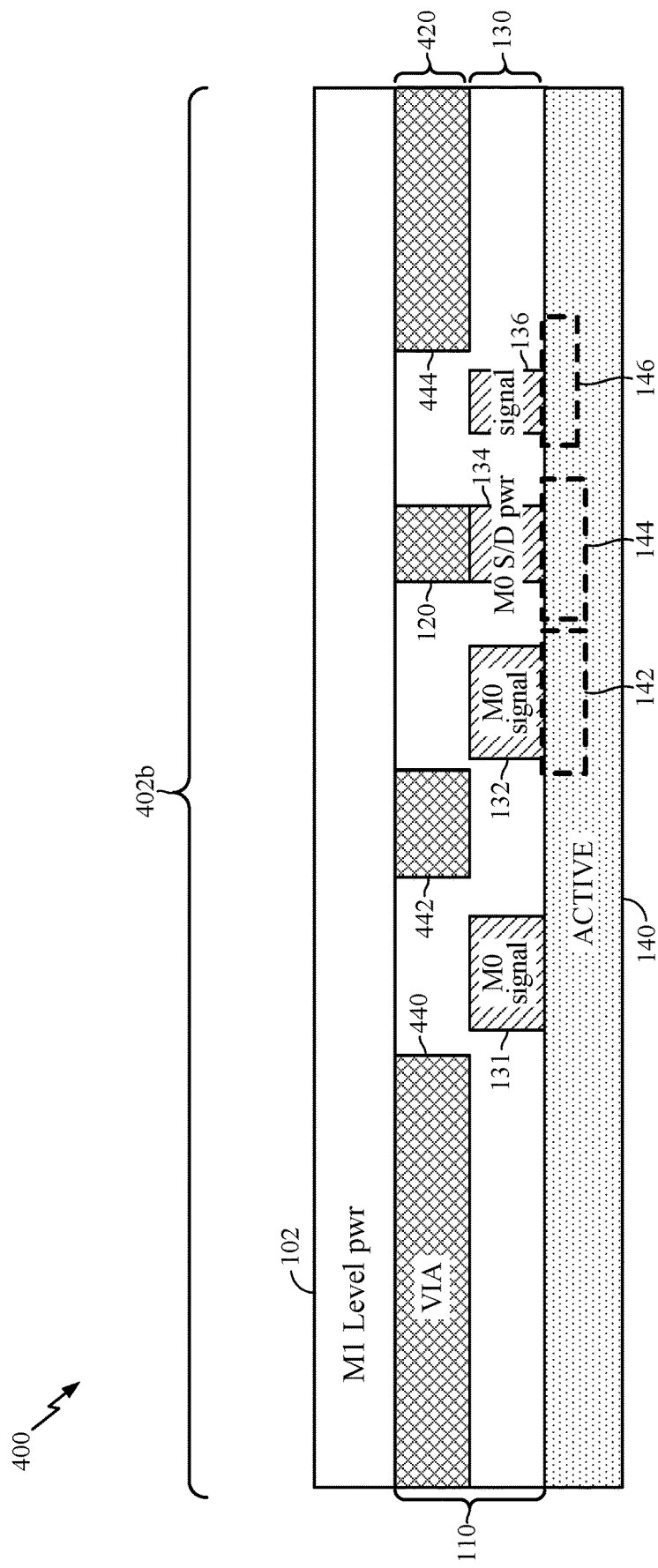
FIG. 4 is a cross-sectional schematic view of an exemplary semiconductor device, in accordance with certain aspects of the present disclosure.

In aspects of the present disclosure, operations 300 may include routing one or more vias (e.g., via 120, described above with reference to FIG. 1) in the dielectric layer, wherein the one or more vias electrically connect one or more traces (e.g., local interconnect 134, described above with reference to FIG. 1 and shown in FIG. 4) of the local interconnect layer to the metal layer. Routing the one or more vias may include routing the one or more vias before adding the one or more metal sections (e.g., metal sections 440, 442, and 444 described below with reference to FIG. 4) in the dielectric layer, as in block 315.

According to aspects of the present disclosure, the one or more metal regions of the routed metal layer of block 315 may be configured as power or ground regions (e.g., power or ground regions of a semiconductor device).

In aspects of the present disclosure, the active device layer of block 305 may include a first transistor and a second transistor. In this case, routing the local interconnect layer as in block 305 may include routing a first local interconnect coupled between the first transistor and the second transistor. One of the metal regions of block 315 may be disposed above an area between the first transistor and the second transistor. Adding the one or more metal sections as in block 315 may include adding a first metal section in the dielectric layer underneath the one of the metal regions and orthogonal to a longitudinal axis of the first local interconnect. The first local interconnect may span a width of the one of the metal regions of block 315 and a width of the first metal section. For certain aspects, a width of the one of the metal regions may be greater than a width of the first metal section. Additionally or alternatively, adding the one or more metal sections as in block 315 may further include adding a second metal section in the dielectric layer underneath the one of the metal regions, orthogonal to the longitudinal axis of the first local interconnect, and on an opposite side of the first local interconnect from the first metal section. The active device layer of block 305 may include a third transistor and a fourth transistor, wherein routing the local interconnect layer as in block 305 includes routing a second local interconnect coupled between the third transistor and the fourth transistor and wherein the second metal section is disposed between the first local interconnect and the second local interconnect.

According to aspects of the present disclosure, the one or more metal sections may include at least one of tungsten (W), cobalt (Co), ruthenium (Ru), or an alloy of any combination of those metals.

FIG. 4 is a cross-sectional schematic view of an exemplary semiconductor device 400, in accordance with certain aspects of the present disclosure. The semiconductor device 400 is similar to the semiconductor device 100 shown in FIG. 1 and the semiconductor device 200 shown in FIG. 2, with features that are the same having the same labels as shown in FIGS. 1 & 2. In the exemplary semiconductor device 400, metal sections 440, 442, and 444 of a metal layer 420 are disposed in the dielectric layer 110 underneath a metal region 402b of the metal layer 102 without contacting or being electrically connected to the interconnects 131, 132, and 136. The metal layer 420 may be formed from the same material as the via 120 and thus is electrically conductive. The metal sections 440, 442, and 444 of layer 420 may be formed after the routing of the M0 metal in the local interconnect layer 130 to form the local interconnects 131, 132, 134, and 136. The metal sections 440, 442, and 444 are configured (e.g., dimensions are designed) to avoid electrical contact between the interconnects 131, 132, and 136 and the region 402b of the metal layer 102 (e.g., to avoid shorting those interconnects to the power distribution network or to ground).

The combination of the metal sections 440, 442, and 444 and the region 402b of the metal layer 102 may have a lower resistivity than this region 402b of the metal layer 102 alone. Similarly, the combination of the metal sections 440, 442, and 444 and the region 402b of the metal layer 102 may have a higher electromigration current limit than this region 402b of the metal layer 102 alone, as shown in the exemplary table below:

| M1 resistivity | 70 $\Omega/\mu m$ |
|---|---|
| Power rail electromigration limit | 140 $\mu A$ |

In aspects of the present disclosure, the semiconductor device 400 illustrated in FIG. 4 may include one or more vias 120 disposed in the dielectric layer 110 and electrically connecting one or more traces (e.g., the local interconnect 134) of the local interconnect layer 130 to the metal layer 102. In aspects of the present disclosure, the one or more metal sections 440, 442, and 444 may each have a higher aspect ratio than the one or more vias 120.

According to aspects of the present disclosure, the one or more metal regions (e.g., metal region 402b of the metal layer 102 illustrated in FIG. 4) may be configured as power or ground regions (i.e., power or ground regions of the semiconductor device 400).

According to aspects of the present disclosure the one or more metal sections 440, 442, and 444 illustrated in FIG. 4 may include (e.g., be made of) at least one of tungsten (W), cobalt (Co), ruthenium (Ru), or any combination thereof.

In aspects of the present disclosure, longitudinal axes of the one or more metal sections 440, 442, and 444 in the dielectric layer 110 illustrated in FIG. 4 may be disposed parallel to longitudinal axes of the one or more metal regions (e.g., metal region 402b) of the metal layer 102.

Figure 5:
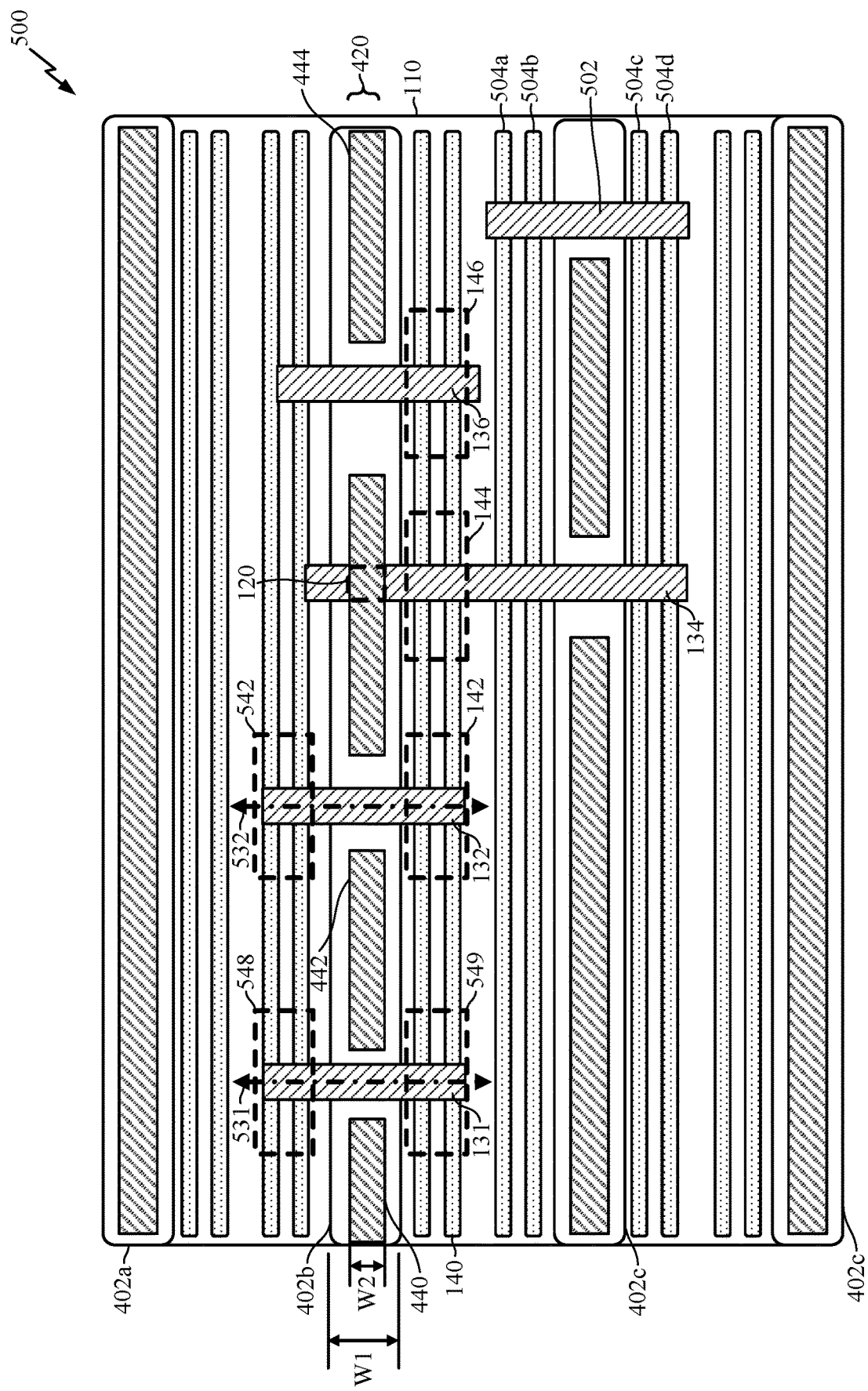
FIG. 5 is a schematic top-down perspective view of an exemplary semiconductor device including features of the semiconductor device shown in FIG. 4, in accordance with certain aspects of the present disclosure.

FIG. 5 is a schematic top-down perspective view of an exemplary semiconductor device 500 including features of the semiconductor device 400 shown in FIG. 4, in accordance with certain aspects of the present disclosure. As illustrated in FIG. 5, the semiconductor device 500 includes several local interconnects 131, 132, 134, 136, 502, etc. The local interconnects connect active devices of the active device layer 140, which may, for example, include multiple fin features 504a, 504b, 504c, 504d, etc. The semiconductor device 500 also includes multiple metal regions 402a, 402b, 402c, and 402d in the M1 layer. Although four metal regions are illustrated in FIG. 5, it is to be understood that a semiconductor device may include more or fewer than four metal regions. At least some of the metal regions (here, as depicted in FIG. 5, each of the metal regions 402a-402d) may have one or more metal sections (e.g., metal sections 440, 442, and 444) of a metal layer 420 disposed underneath the metal regions. As illustrated, the metal sections (e.g., metal sections 440, 442, and 444) do not contact the local interconnects 131, 132, 136, 502.

In aspects of the present disclosure, the active device layer 140 of the semiconductor device 500 illustrated in FIG. 5 may include a first transistor 548 and a second transistor 549, and the local interconnect layer 130 may include a first local interconnect 131 coupled between the first transistor 548 and the second transistor 549. One or more of the metal regions (e.g., metal region 402b) may be disposed above an area between the first transistor 548 and the second transistor 549, and the one or more metal sections may include a first metal section 440 disposed in the dielectric layer 110 underneath the one of the metal regions and having a longitudinal axis orthogonal to a longitudinal axis 531 of the first local interconnect 131. In aspects of the present disclosure, the first local interconnect 131 may span a width (W1) of the one of the metal regions and a width (W2) of the first metal section. In aspects of the present disclosure, a width of one of the metal regions may be greater than, the same as, or less than a width of a metal section. In aspects of the present disclosure, the one or more metal sections may also include a second metal section 442 disposed in the dielectric layer underneath the one of the metal regions, having a longitudinal axis orthogonal to the longitudinal axis of the first local interconnect 131, and located on an opposite side of the first local interconnect 131 from the first metal section 440. In aspects of the present disclosure, the active device layer comprises a third transistor 542 and a fourth transistor 142, wherein the local interconnect layer further comprises a second local interconnect 132 coupled between the third transistor and the fourth transistor, and wherein the second metal section 442 is disposed between the first local interconnect 131 and the second local interconnect 132.

In aspects of the present disclosure, a semiconductor device includes an active device layer; a local interconnect layer disposed above the active device layer; a dielectric layer disposed above the local interconnect layer; a metal layer disposed above the dielectric layer; and one or more metal sections disposed in the dielectric layer underneath one or more metal regions of the metal layer, wherein none of the one or more metal sections is electrically connected to a trace in the local interconnect layer. The metal sections decrease resistivity and increase current capacity without electromigration of the metal layer, which may be part of a power distribution network of a semiconductor device (e.g., an integrated circuit (IC)). The semiconductor device may include one or more vias disposed in the dielectric layer and electrically connecting one or more traces of the local interconnect layer or active devices to the metal layer. The metal sections may have a higher aspect ratio than the vias. The one or more metal regions of the metal layer may be configured as power or ground regions. The active device layer may include a first transistor and a second transistor, and the local interconnect layer may include a first local interconnect coupled between the first transistor and the second transistor. One of the metal regions may be disposed above an area between the first transistor and the second transistor, and the one or more metal sections may include a first metal section disposed in the dielectric layer underneath the one of the metal regions and orthogonal to a longitudinal axis of the first local interconnect. The first local interconnect may span a width of the one of the metal regions and a width of the first metal section. A width of the one of the metal regions may greater than a width of the first metal section. The one or more metal sections may include a second metal section disposed in the dielectric layer underneath the one of the metal regions, orthogonal to the longitudinal axis of the first local interconnect, and on an opposite side of the first local interconnect from the first metal section. The active device layer may include a third transistor and a fourth transistor; the local interconnect layer may include a second local interconnect coupled between the third transistor and the fourth transistor, and the second metal section may be disposed between the first local interconnect and the second local interconnect. The one or more metal sections may include at least one of tungsten (W), cobalt (Co), or ruthenium (Ru). Axes of the one or more metal sections in the dielectric layer may be disposed parallel to axes of the one or more metal regions of the metal layer.

The above description provides examples of semiconductor devices (e.g., integrated circuits (ICs)) with metal sections added in a dielectric layer under a routed metal layer and above an active device layer of the semiconductor devices, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more."

Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. Generally, where there are operations illustrated in figures, those operations may have corresponding counterpart means-plus-function components with similar numbering.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A method for fabricating a semiconductor device, comprising:
   routing a local interconnect layer above an active device layer;
   routing a metal layer above the active device layer, wherein the metal layer is separated from the active device layer by a dielectric layer; and
   adding one or more metal sections in the dielectric layer underneath and electrically connected to one or more metal regions of the routed metal layer, wherein none of the one or more metal sections is electrically connected to a trace in the local interconnect layer.

2. The method of claim 1, further comprising fabricating the semiconductor device according to the routed local interconnect layer, the routed metal layer, and the one or more metal sections.

3. The method of claim 1, further comprising routing one or more vias in the dielectric layer, wherein the one or more vias electrically connect one or more traces of the local interconnect layer to the metal layer.

4. The method of claim 3, wherein routing the one or more vias comprises routing the one or more vias before adding the one or more metal sections in the dielectric layer.

5. The method of claim 1, wherein the one or more metal regions of the routed metal layer are configured as power or ground regions.

6. The method of claim 1, wherein the active device layer comprises a first transistor and a second transistor and wherein routing the local interconnect layer comprises routing a first local interconnect coupled between the first transistor and the second transistor.

7. The method of claim 6, wherein one of the metal regions is disposed above an area between the first transistor and the second transistor and wherein adding the one or more metal sections comprises adding a first metal section in the dielectric layer underneath the one of the metal regions and orthogonal to a longitudinal axis of the first local interconnect.

8. The method of claim 7, wherein the first local interconnect spans a width of the one of the metal regions and a width of the first metal section.

9. The method of claim 7, wherein a width of the one of the metal regions is greater than a width of the first metal section.

10. The method of claim 7, wherein adding the one or more metal sections further comprises adding a second metal section in the dielectric layer underneath the one of the metal regions, orthogonal to the longitudinal axis of the first local interconnect, and on an opposite side of the first local interconnect from the first metal section.

11. The method of claim 10, wherein the active device layer comprises a third transistor and a fourth transistor, wherein routing the local interconnect layer comprises routing a second local interconnect coupled between the third transistor and the fourth transistor, and wherein the second metal section is disposed between the first local interconnect and the second local interconnect.

12. A semiconductor device comprising:
    an active device layer;
    a local interconnect layer disposed above the active device layer;
    a dielectric layer disposed above the local interconnect layer;
    a metal layer disposed above the dielectric layer; and
    one or more metal sections disposed in the dielectric layer underneath and electrically connected to one or more metal regions of the metal layer, wherein none of the one or more metal sections is electrically connected to a trace in the local interconnect layer.

13. The semiconductor device of claim 12, further comprising one or more vias disposed in the dielectric layer and electrically connecting one or more traces of the local interconnect layer to the metal layer, wherein the one or more metal sections have a higher aspect ratio than the one or more vias.

14. The semiconductor device of claim 12, wherein the active device layer comprises a first transistor and a second transistor and wherein the local interconnect layer comprises a first local interconnect coupled between the first transistor and the second transistor.

15. The semiconductor device of claim 14, wherein one of the metal regions is disposed above an area between the first transistor and the second transistor and wherein the one or more metal sections comprises a first metal section disposed in the dielectric layer underneath the one of the metal regions and orthogonal to a longitudinal axis of the first local interconnect.

16. The semiconductor device of claim 15, wherein the first local interconnect spans a width of the one of the metal regions and a width of the first metal section.

17. The semiconductor device of claim 15, wherein a width of the one of the metal regions is greater than a width of the first metal section.

18. The semiconductor device of claim 15, wherein the one or more metal sections further comprise a second metal section disposed in the dielectric layer underneath the one of the metal regions, orthogonal to the longitudinal axis of the first local interconnect, and on an opposite side of the first local interconnect from the first metal section.

19. The semiconductor device of claim 18, wherein the active device layer comprises a third transistor and a fourth transistor, wherein the local interconnect layer further comprises a second local interconnect coupled between the third transistor and the fourth transistor, and wherein the second metal section is disposed between the first local interconnect and the second local interconnect.

20. The semiconductor device of claim 12, wherein axes of the one or more metal sections in the dielectric layer are disposed parallel to axes of the one or more metal regions of the metal layer.

\* \* \* \* \*